United States Patent
Lin et al.

(10) Patent No.: US 10,177,252 B2
(45) Date of Patent: Jan. 8, 2019

(54) SEMICONDUCTOR DEVICE ISOLATION WITH RESURF LAYER ARRANGEMENT

(71) Applicant: NXP USA, Inc., Austin, TX (US)

(72) Inventors: Xin Lin, Phoenix, AZ (US); Hongning Yang, Chandler, AZ (US); Ronghua Zhu, Chandler, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/348,768

(22) Filed: Nov. 10, 2016

(65) Prior Publication Data

US 2018/0130903 A1    May 10, 2018

(51) Int. Cl.
| | |
|---|---|
| *H01L 29/78* | (2006.01) |
| *H01L 29/06* | (2006.01) |
| *H01L 29/47* | (2006.01) |
| *H01L 29/10* | (2006.01) |
| *H01L 21/265* | (2006.01) |
| *H01L 29/66* | (2006.01) |

(52) U.S. Cl.
CPC .... *H01L 29/7816* (2013.01); *H01L 21/26513* (2013.01); *H01L 29/0634* (2013.01); *H01L 29/1095* (2013.01); *H01L 29/47* (2013.01); *H01L 29/66681* (2013.01)

(58) Field of Classification Search
CPC .............. H01L 29/0623; H01L 29/063; H01L 29/0638
See application file for complete search history.

(56) References Cited

U.S. PATENT DOCUMENTS

| | | | |
|---|---|---|---|
| 6,882,023 B2 | 4/2005 | Khemka et al. | |
| 8,193,585 B2 | 6/2012 | Grote et al. | |
| 2010/0123195 A1* | 5/2010 | Lee ..................... | H01L 29/0634 257/335 |
| 2012/0043608 A1* | 2/2012 | Yang .................. | H01L 29/0653 257/336 |
| 2013/0134511 A1* | 5/2013 | Yang .................... | H01L 21/761 257/339 |
| 2014/0001477 A1 | 1/2014 | Chen et al. | |
| 2014/0001546 A1 | 1/2014 | Bode et al. | |
| 2014/0320174 A1* | 10/2014 | Lu ........................ | H01L 29/7816 257/337 |

* cited by examiner

*Primary Examiner* — Marc Armand
*Assistant Examiner* — Quinton Brasfield (57) ABSTRACT

A device includes a semiconductor substrate, a doped isolation barrier disposed in the semiconductor substrate, a body region disposed in the semiconductor substrate within the doped isolation barrier and in which a channel is formed during operation, an isolation contact disposed at the semiconductor substrate and to which a voltage is applied during operation, and a plurality of reduced surface field (RESURF) layers disposed in the semiconductor substrate, the plurality of reduced surface field (RESURF) layers being arranged in a stack between the body region and the isolation contact.

12 Claims, 4 Drawing Sheets

SEMICONDUCTOR DEVICE ISOLATION WITH RESURF LAYER ARRANGEMENT

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor (MOS) field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices are designed to prevent a direct forward bias or punch-through path from a body region of the LDMOS device to an underlying substrate.

LDMOS devices are often used in applications, such as automotive applications, involving operational voltages greater than 40 volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

Some LDMOS devices have a "double RESURF" structure. For example, in n-channel LDMOS devices, the drift space contains an upper level n-type region and a lower level p-type region, with an n-type buried isolation layer beneath the p-type region. The double nature of the structure refers to the depletion of the two regions and the reduction of the electric field in the related junction areas. Double RESURF structures typically apply the drain voltage to isolation regions in order to deplete the both the n-type and p-type regions.

However, biasing the isolation regions at the drain voltage increases the field stress between the body of the LDMOS device and a buried isolation layer. Breakdown may instead occur between the body and the buried isolation layer, thereby limiting the breakdown voltage. Previous efforts to address such source/body-based breakdown have introduced fabrication challenges or degraded the electrostatic discharge (ESD) and safe operating area (SOA) performance of the device.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Embodiments of laterally diffused metal oxide semiconductor (LDMOS) and other power transistor devices with isolation via a reduced surface field (RESURF) layer arrangement are described, along with methods of fabricating such devices. The RESURF layers of the arrangement are disposed between an isolation contact and a body region of the transistor devices. The depleted nature of the RESURF layers results in a more uniform distribution of the electrostatic potential difference between the isolation contact and the body region. The more evenly distributed electrostatic potential difference establishes a higher breakdown voltage (e.g., BVDSS) for the transistor device.

The electrostatic potential difference is more evenly distributed in both the lateral and vertical dimensions in the areas around the body region. Better distribution in both the lateral and vertical dimensions addresses the possibility of breakdown with various isolation components, including a buried doped isolation layer. Protection against vertical breakdown may be useful in cases in which further lateral separation of the device body and isolation tub sidewalls via, for instance, a wider segment of the epitaxial layer, does not improve the breakdown voltage level but, in fact, lowers the breakdown voltage level. The disclosed devices may thus avoid the presence of epitaxial layer regions between the device body and the sidewalls of the doped isolation barrier (e.g., isolation tub) that would otherwise lead to uneven distribution of the electrostatic potential difference.

The RESURF layer arrangement also electrically couples the isolation contact to a doped isolation barrier, such as an isolation tub. Some of the bias voltage applied to the isolation contact is sustained across a depleted region of the RESURF layer arrangement. Only a portion of the bias voltage is therefore passed on to the regions and layers of the doped isolation barrier. The depleted region of the RESURF layer arrangement thus provides partial biasing, or lifting, of the isolation potential.

The partial lifting of the isolation potential avoids biasing the doped isolation barrier at voltage levels that would otherwise establish the breakdown voltage level of the device. As a result, the transistor devices experience significantly less voltage stress between the body and isolation regions. Higher breakdown voltage (e.g., BVDSS) levels may be achieved for this reason as well.

The partial lifting of the isolation potential is achieved while still using an isolation contact to bias the doped isolation barrier. The improvements in breakdown voltage are therefore achieved without sacrificing the option of incorporating, for instance, a Schottky diode at the isolation contact. Use of a Schottky contact at the isolation contact is useful in connection with application scenarios in which nodes experience a negative potential during switching. For example, many system-on-a-chip (SOC) applications involve an inductive load, which leads to nodes experiencing a negative potential during switching. In such scenarios, the diodes formed between the isolation tub and substrate become forward biased. A significant amount current would thus be injected into the substrate without the Schottky contact. The availability of the Schottky contact is thus a desirable feature of this approach to partial lifting of the isolation potential and otherwise improving breakdown voltage levels.

The improved breakdown voltage levels may be achieved without increasing the cost of manufacturing the transistor devices. The RESURF layer arrangement may be formed without adding any dopant implantation procedures. For instance, preexisting dopant implantation procedures configured to form drift regions of n-channel and p-channel transistor devices may be used. The preexisting dopant implantation procedures may include a pair of chain implantation procedures used to form other RESURF arrangements of the transistor devices, including arrangements for drift and body regions.

Figure 1:
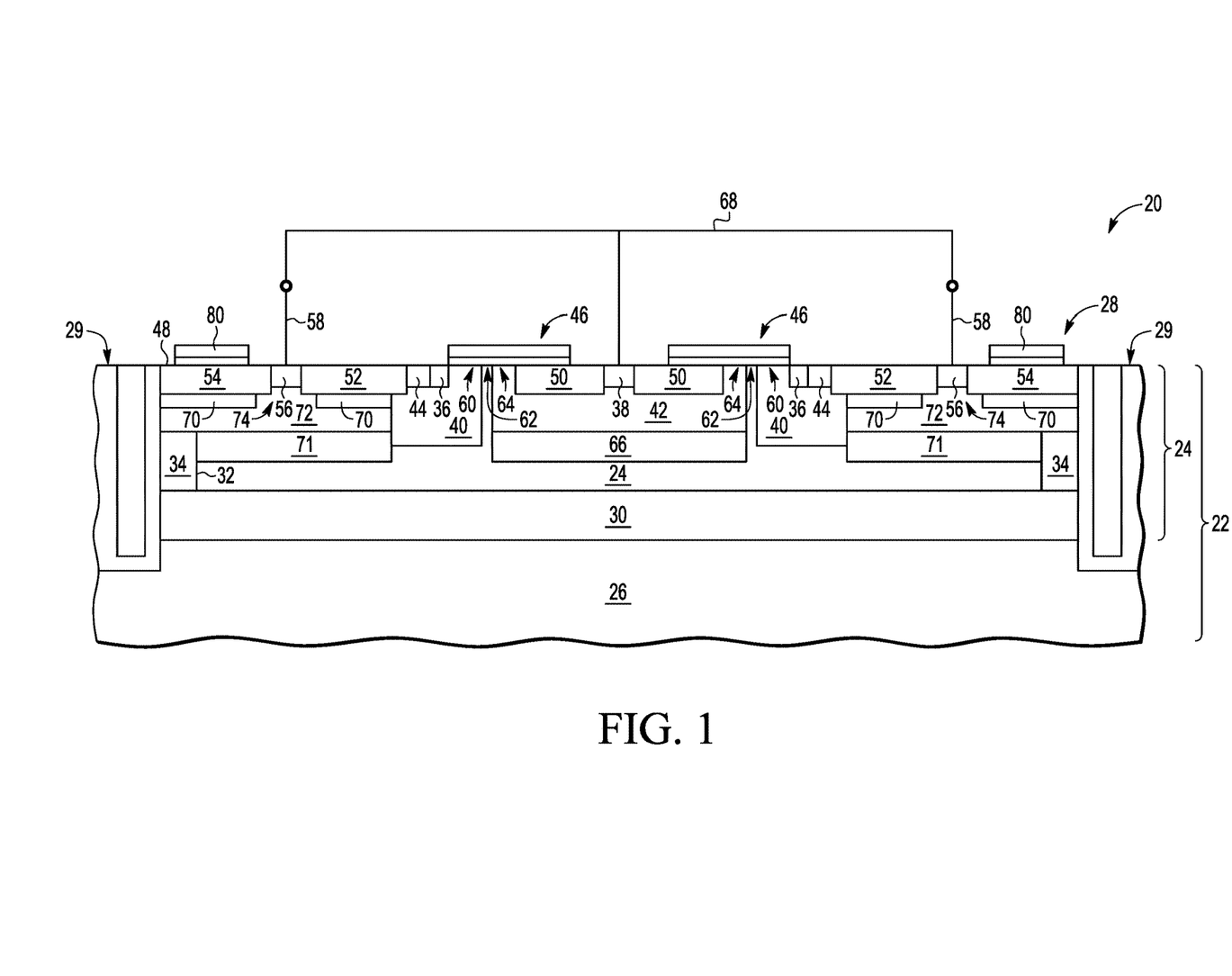
FIG. 1 is a cross-sectional, schematic, partial view of an example n-channel LDMOS (or NLDMOS) transistor with isolation via a RESURF layer arrangement in accordance with one embodiment.

FIG. 1 is a schematic cross-sectional view of an example of an LDMOS device 20 constructed in accordance with one embodiment. In this embodiment, the device 20 is configured as an n-channel device. The device 20 may be configured as a RESURF transistor. In this example, the device 20 has a double RESURF arrangement.

The device 20 includes a semiconductor substrate 22, which may, in turn, include a number of epitaxial layers 24. In this example, the semiconductor substrate 22 includes a single p-type epitaxial layer 24 grown on an original, bulk substrate 26. The original substrate 26 may be a lightly doped substrate, or a heavily doped p-type substrate in some cases, such as those having multiple epitaxial layers. The substrate 22 may be biased via a substrate contact region at, for instance, ground potential. The device 20 may alternatively or additionally include non-epitaxial layers in which one or more device regions are formed.

Any one or more of the layers of the semiconductor substrate 22 may include silicon. Alternative or additional semiconductor materials may be used in other embodiments. The structural, material, and other characteristics of the semiconductor substrate 22 may vary from the example shown. Although useful for increasing the breakdown voltage in connection with bulk substrates, the disclosed embodiments are not limited to bulk substrates. For example, the semiconductor substrate 22 may be or include a silicon-on-insulator (SOI) substrate. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 28 of the device 20 is depicted in FIG. 1. The device area 28 may correspond with the area in which the active components of the device 20 are disposed. In this case, the device area 28 is laterally symmetrical about, e.g., a drain region. In some cases, the device 20 is non-symmetrical in one or more lateral dimensions. The device area 28 may be defined by one or more device isolating layers or other regions in the semiconductor substrate 22 (e.g., the epitaxial layer 24). The regions may be doped semiconductor regions and/or undoped (e.g., dielectric) regions. In this example, the device area 28 is defined at least in part by a deep-trench isolation (DTI) ring 29. The structures in the device area 28 are laterally isolated from a remainder of the substrate 22 by the deep-trench isolation (DTI) ring 29.

The device 20 includes a doped isolation barrier for further device isolation. The doped isolation barrier is disposed along the periphery of the device area 28. The doped isolation barrier may include a number of doped isolation layers and regions provided within the DTI ring 29 along the periphery of the device area 28. The layers and regions of the doped isolation barrier may laterally and/or otherwise surround the remainder of the device area 28 for further isolation of the device 20. For instance, the regions or layers of the doped isolation barrier may form an isolation tub in which the active components of the device 20 are disposed. The isolation tub includes a bottom and sidewalls extending upward from the bottom. In this example, the doped isolation barrier includes a buried isolation layer 30 that defines a bottom of the isolation tub. The doped isolation barrier also includes sidewalls 32. One or more isolation wells 34 may define the sidewalls 34. The isolation well 34 may thus be ring-shaped to laterally surround the device area 28. The isolation well(s) is/are buried wells in this case. The isolation wells 34 may be stacked upon one another. One or more of the layers and regions of the doped isolation barrier may be disposed along the DTI ring 29. In the example of FIG. 1, outer boundaries of the buried layer 30 and the isolation well 34 are in contact with the DTI ring 29. In this example, with a p-type substrate, the regions and layers of the doped isolation barrier are n-type regions. The doped isolation barrier may vary from the embodiment shown. For instance, the isolation well 34 may extend further upward in other cases, e.g., to reach an STI region 54.

The buried isolation layer 30 extends across the entire lateral extent of the device area 28. The buried isolation layer 30 may be formed in the semiconductor substrate 22 before the growth of the epitaxial layer 24 thereof. The buried n-type layer may thus extend laterally across and under the regions disposed, and later formed, in the core device area 42. The buried isolation layer 30 may alternatively or additionally assist in depletion of a drift region of the device 20 to support the RESURF effect.

One or more of the layers and regions of the doped isolation barrier may have a dopant concentration level and/or be otherwise configured for high voltage (HV) operation (e.g., high side operation in which the terminals of the device 20 are level shifted relative to the semiconductor substrate 22, which may be grounded). For example, the higher dopant concentration level of the isolation barrier layer may be useful in preventing punch-through. However, the layout, arrangement, configuration, and/or other characteristics of the device isolation wells, layers, or other regions may vary from the example shown. For instance, additional or alternative device isolation wells, layers or regions may be provided in the semiconductor substrate 22.

Within the device area 28, the device 20 includes a source region 36, a drain region 38, a body region 40 in which the source region 36 is disposed, and a drift region 42 in which the drain region 38 is disposed. In this example, the body region 40 is a p-type well formed in the epitaxial layer 24 of the substrate 22. The body region 40 may be biased via one or more heavily doped p-type body contact regions or electrodes 44 formed in or otherwise above the p-type well of the body region 48 in the semiconductor substrate 22. The dopant concentration of each contact region 44 may be at a level sufficient to establish an ohmic contact for the body region 40.

The source and drain regions 36 and 38 are laterally spaced from one another in the lateral dimension shown in the cross-section of FIG. 1. Any number of source or drain regions 36, 38 may be provided. The drain region 38 need not be centered or otherwise disposed between, or laterally surrounded by, the source region 36 as shown. In this example, the source and drain regions 36 and 38 are heavily doped n-type doped portions of the epitaxial layer 24. The heavily doped n-type source region 36 is disposed within, on, and/or otherwise above the body region 40. The heavily n-type doped drain region 38 is spaced from the body region 40 along the lateral dimension shown in FIG. 1. Such spacing defines a conduction path of the device between the source and drain regions 36 and 38. The regions 36, 38, or a portion thereof, may have a dopant concentration at a level sufficient to establish ohmic contacts. In this n-channel LDMOS configuration, the drain region 38 is biased at a relatively high drain-source voltage, Vds, relative to the source region 36.

The device 20 includes one or more gate structures 46 formed on or above a surface 48 of the semiconductor substrate 22. Each gate structure 46 is disposed between the source region 36 and the drain region 38. In some embodiments, the gate structure 46 surrounds the drain region 38, which may be centrally or internally disposed within the device area 28. Alternatively, the gate structure 46 may be arranged in a dual gate finger configuration in which two transistors are symmetrically arranged to share the same drain region 38. The gate structure 46 includes a polysilicon or other conductive plate located on or above a gate dielectric. For example, the gate dielectric may include silicon dioxide (or oxide) deposited or otherwise formed on the surface 48. The gate structure 46 may include one or more dielectric sidewall spacers disposed along lateral edges of the gate structure 46. The sidewall spacers may cover the lateral edges to act as a silicide blocker to prevent a silicide short along the surface of the substrate 22. The sidewall spacers may provide spacing to separate the conductive components of the gate structure 46 from the source region 36 and other regions of the device region 28. In some cases, one of the sidewall spacers is used for alignment purposes in defining an edge of the source region 36.

Other aspects of the configuration of the gate structure 46 may also vary. For instance, the configuration of the gate structure 46 may include multiple conductive layers (e.g., polysilicon plates), one or more Faraday shields, and/or other components. The components, materials, configuration, and other characteristics of the gate structure 46 may vary from the example shown.

A number of shallow trench isolation (STI) regions 50, 52, 54 may be formed at the surface 48 in the semiconductor substrate 22. In this embodiment, one of the STI regions 50 is disposed between the gate structure 46 and the drain region 38 in the drift region 42 to form a field drift arrangement. The field drift arrangement is configured to protect the gate structure 46 from the high voltage applied to the drain region 38. For example, the STI region 50 may be configured to prevent or minimize hot carrier injection (HCI) into the oxide layer of the gate structure 46.

The other STI regions 52, 54 are disposed along the periphery of the device area 28. The STI region 52 is disposed between the body contact region 44 and an isolation contact region 56 for an isolation contact 58 disposed at the surface 48. The isolation contact is disposed within, and laterally offset from, the sidewall 32 of the doped isolation barrier. The STI region 54 is disposed between the isolation contact region 56 and the DTI ring 29. The STI regions 52, 54 establish a spacing around the isolation contact region 56 to avoid, for instance, silicide or other electrical shorts at the surface 48. The spacing is also useful in connection with the high voltage applied to the isolation contact region 56 and the body region 40 and the DTI ring 29.

Additional, fewer, or alternative STI regions may be disposed in the semiconductor substrate 22 to isolate or separate various contact regions, as well as other regions within the device area 28 of the device 20. For example, the body contact region 44 and the source region 36 may be separated by an additional STI region.

The conduction path of the device 20 may vary from the example shown. For example, the device 20 may include one or more lightly or intermediately doped transition regions (e.g., n-type lightly doped drain, or NLDD, regions) at or near the source and drain regions 36 and 38. Each transition region may be or include a diffused region formed in connection with the source region 36 and the drain region 38. Such transition regions may couple the source region 36 to a channel region 60 of the device 20. In one example, the device 20 includes an NLDD region adjacent the source region 36, in which case the NLDD region extends laterally under the gate structure 46.

When the gate structure 46 is biased, charge carriers (in this case, electrons; alternatively, holes) accumulate in the channel region 60. Each channel region 60 (or a portion thereof) may be formed in the body region 40 under the gate structure 46. In this example, the accumulation of electrons results in a charge inversion in the channel region 60 from the p-type of the body region 40 to an n-type conduction layer or area near the surface 48 of the semiconductor substrate 22. Once a sufficient amount of the charge carriers accumulate in the conduction layer or area, charge carriers are capable of flowing from the source region 36 toward the drain region 38 through the channel region 60.

The channel region 60 may include other regions or areas in the semiconductor substrate 22 in which charge inversion or accumulation occurs as a result of the bias applied to the gate structure 46. Charge carriers may also accumulate outside of or beyond the body region 40. For example, charge carriers may accumulate in a region 62 of the epitaxial layer 24 between the body region 40 and the drift region 42, as well as in an accumulation region or portion 64 of the drift region 42 near the surface 48 under the gate structure 46.

After exiting the channel region 60, the charge carriers drift through the drift region 42 to reach the drain region 38. The drift region 42 electrically couples the drain region 38 and the channel region 60. The drift region 42 may be configured to allow the charge carriers to drift under the electric field established by the drain-source voltage applied between the drain region 38 and the source region 36. In this example, the drift region 42 is an n-type well that laterally extends under the STI region 50 as a field drift region.

The drift region 42 may be configured to be depleted to reduce the magnitude of the electric field in areas in and/or around the drift region 42 via the reduced surface field (RESURF) effect. The field reduction increases the voltage at which breakdown occurs along the conduction path of the device 20. In this example, the drift region 42 is depleted both laterally and vertically. A junction forms between the n-type well of the drift region 42 and the p-type epitaxial layer 24 and/or the body region 40 to establish a lateral RESURF effect. The junction is reverse-biased as a result of the application of a drain voltage Vds between the source region 36 and the drain region 38. The drift region 42 is also depleted vertically by a p-type buried well region 66 disposed under the drift region 42.

Further depletion in and around the drift region 50 may be achieved via a double RESURF arrangement in which a voltage is applied to the buried isolation layer 30 to reverse bias a junction along the buried well region 66. To that end, the device 20 includes an interconnect 68 (e.g., a patterned metal interconnect) supported by the substrate 22 to electrically tie the drain region 38 to the isolation contact 58 and, in this example, the isolation contact region 56. The drain-source bias voltage is applied during operation to the isolation contact 58 to bias the buried isolation layer 30 and other regions of the doped isolation barrier, in this case, the isolation well 34. The biasing of the doped isolation barrier is further described below.

The device 20 includes one or more additional RESURF arrangements or depleted regions to help prevent breakdown, impact ionization, and/or other detrimental conditions. The RESURF arrangement(s) or depleted region(s) are disposed in the substrate 22 outside of the conduction path of the device 20 (e.g., outward of the body region 40). The RESURF arrangement may include a number of RESURF layers or regions arranged in a stack. In the example of FIG. 1, the device 20 includes three RESURF layers—an upper layer 70, a buried layer 71, and a middle layer 72 disposed between the upper and buried layers 70, 71. The RESURF arrangement is established by alternating the conductivity type of the RESURF layers 70-72. In this case, the upper and buried layers 70, 71 are p-type regions (a conductivity type in common with the body region 40), and the middle layer 72 is an n-type region (a conductivity type in common with the doped isolation barrier). Alternating the conductivity types of the layers 70-72 depletes one or more of the layers 70-72 of charge carriers. Each layer 70-72 may be fully depleted. The conductivity types may vary, for instance, in conjunction with other RESURF layer arrangements.

The stack of layers 70-72 is disposed between the body region 40 and the isolation contact 58. In the example of FIG. 1, each layer 70-72 includes a respective portion disposed between the body region 40 and the isolation contact 58, and a respective portion that extends outward from the isolation contact 58. The extent to which the layers 70-72 extend beyond the isolation contact 58 may vary in other cases.

In the example of FIG. 1, each of the layers 70-72 is laterally adjacent to, and in contact with, the body region 40. There is no spacing between the layers 70-72 and the body region 40. With the lack of spacing, no portion of the epitaxial layer 24 is disposed between the body region 40 and the RESURF layer arrangement. In other cases, one or more of the layers of the stack may be spaced from the body region 40. The layer(s) may nonetheless be fully depleted, or sufficiently depleted, despite such spacing.

The positioning and depletion of the layers 70-72 helps to uniformly distribute the difference in electrostatic potential between the body region 40 and the isolation contact 58. The layers 70-72 present one or more depletion regions between the body region 40 and the isolation contact 58. In the example of FIG. 1, each of the layers 70-72 is depleted between the body region 40 and the isolation contact 58. The portions of the layers 70-72 between the body region 40 and the isolation contact 58 may be fully depleted or sufficiently depleted of charge carriers to sufficiently distribute the electrostatic potential. Either way, the distribution of the electrostatic potential becomes more uniform in the area between the body region 40 and the isolation contact 58. As a result, the likelihood of impact ionization in that area decreases. The breakdown voltage of the device 100 thereby increases relative to devices with, for instance, epitaxial layer or other substrate spacing.

The RESURF layer arrangement may provide further benefits beyond electrostatic potential distribution near the body region 40. For instance, one or more layers or elements of the RESURF layer arrangement may be configured to establish the voltage at which the doped isolation barrier is biased. In the example of FIG. 1, the RESURF layer arrangement is capable of partially lifting the voltage of the doped isolation barrier to the voltage applied to the isolation contact 58, as described below. As a result, the doped isolation barrier is biased at a voltage level lower than the voltage applied to the isolation contact 58. The lower bias voltage of the doped isolation barrier further improves the breakdown voltage performance of the device 100 by decreasing the electrostatic potential difference between the body region 40 and the regions of the doped isolation barrier, such as the buried isolation layer 30.

To partially lift the isolation barrier potential, one or more layers of the RESURF layer arrangement is configured as an isolation coupling layer that electrically couples the isolation contact 58 and the doped isolation barrier. The isolation coupling layer may be a depleted region disposed in the substrate 22 between the isolation contact 58 and the doped isolation barrier. In the example of FIG. 1, the middle layer 72 acts as the depleted region or isolation coupling layer. As shown in FIG. 1, the isolation contact 58 is disposed within, and laterally offset from, the sidewall 32 of the doped isolation barrier. The middle layer 72 laterally extends outward from the isolation contact 58 to reach the sidewall 32 of the doped isolation barrier. As shown in FIG. 1, the middle layer 72 may laterally overlap the isolation well 34 to contact the doped isolation barrier. In other cases, the isolation well extends upward to reach the STI region 54, in which case the middle layer 72 is laterally adjacent to the sidewall 32 of the doped isolation barrier. One or more of the other layers 70, 71 of the stack may also extend laterally outward from the isolation contact 58 to reach the DTI ring 29 or the sidewall 32 of the doped isolation barrier. In the example of FIG. 1, the outer segment of the upper layer 70 reaches the DTI ring 29, while the buried layer 71 reaches the isolation well 34. The lateral extent of these other layers 70, 71 of the stack depletes the middle layer 72 between the isolation contact 58 and the doped isolation barrier. The depletion again lowers the presence of impact ionization in the area between the isolation contact 58 and the doped isolation barrier. The lateral extent of these other layers 70, 71 may vary from the example shown, and still achieve sufficient depletion. For instance, the upper layer 70 may be spaced from the DTI ring 29. Alternatively or additionally, the upper layer 70 and the buried layer 71 reach the sidewall 32 of the doped isolation barrier while the isolation well 34 extends upward to reach the STI region 54.

One or more layers of RESURF layer arrangement are configured to accommodate the electrical coupling of the isolation contact 58 and the doped isolation barrier. In the example of FIG. 1, the upper layer 70 is discontinuous with a gap 74 at the isolation contact 58. The gap separates the upper layer 70 into outer and inner segments. The gap 74 allows the middle layer 72 to extend upward to reach the isolation region 56 and/or the isolation contact 58. The middle layer 72 may be formed by a well of the plurality of RESURF layers. The well includes a first portion that forms the middle layer 72 and a second portion disposed in the gap 74. As described above, the portions of the well may be counter-doped to form one or more of the other layers of the RESURF arrangement, including, for instance, the upper layer 70. In this case, the counter-doping results in the gap 74 being laterally wider than the isolation contact 58, but other widths may be used. For instance, the width of the gap 74 may correspond with the width of the isolation contact 58 or the isolation contact region 56. As described below, the doping and counter-doping to form the well and layers 70-72 of the RESURF layer arrangement may use pre-existing implant(s), including, for instance, one or more implants configured to form drift regions of the device 20 or other devices.

The depleted region(s) or layer(s) of the RESURF layer arrangement allow the buried isolation layer 30 and other components of the doped isolation barrier to be biased at a voltage level lower than the drain-source bias voltage (e.g., the voltage applied to the isolation contact 58). The full drain-source bias voltage is not directly applied to the doped isolation barrier. Instead, the potential of the doped isolation barrier is instead partially lifted to the voltage level of the drain-source bias voltage to lower the voltage stress between the body region 40 and the doped isolation barrier (e.g., the buried isolation layer 30).

The extent of the voltage drop across the depleted region of the RESURF layer arrangement may vary in accordance with the extent to which the middle layer 72 is depleted of charge carriers. The middle layer 72 may be partially or fully depleted of charge carriers. The extent to which the middle layer 72 is depleted of charge carriers may be enhanced by one or more structures or other characteristics of the periphery of the device area 28. Depletion in the vertical direction is also attained via a conductive flap 80 supported by the substrate 22 and positioned outside of the isolation contact 58. The conductive flap 80 is biased during operation to deplete one or more of the layers of the RESURF layer arrangement. In this n-channel example, the conductive flap 80 may be grounded or otherwise biased at a low voltage level relative to the drain-source bias voltage. The conductive flap 80 may thus help the distribution of potential lines within the RESURF layer arrangement.

The conductive flap 80 may include a polysilicon plate. Other conductive materials may be used. For example, one or more metal layers may be used. The construction, configuration, and other characteristics of the conductive flap 80 may vary. A variety of conductive structures may be used.

The conductive flap 80 may be spaced from the surface 48 of the substrate 22 by one or more passivation layers 82. Any one or more dielectric materials may be used for the passivation layer(s) 82.

The extent of the depletion may be enhanced both laterally and/or vertically in other ways. For example, gaps may be introduced in the dopant implantation area(s) for one or more of the layers of the RESURF layer arrangement to effectively lower the dopant concentration level of the layer(s) after diffusion.

The formation of the above-described RESURF layers and depleted regions may not increase the complexity or cost of fabricating the device 20. For instance, and as described below in connection with the exemplary fabrication process shown in FIG. 5, pre-existing implants (and corresponding mask layers) may be used to form the RESURF layers and/or depleted regions. For instance, the implants used to form the drift region 42 and the buried well region 66 may also be used to form the buried and middle layers 71, 72. One or more additional pre-existing implants may also be used to form these and other RESURF layers. In the example of FIG. 1, the profile of the RESURF layers 70-72 may be achieved by combining those implants with an additional implant used to form a p-type drift region of a p-channel LDMOS or other transistor device.

FIG. 1 depicts the device 20 in simplified form. For instance, only one cross-section of the device 20 is shown. The device 20 may be configured differently at or near ends of the device 20 not shown in FIG. 1. For example, the gate structure 46 may be U-shaped or arch-shaped (e.g., a single lateral connection) or toroidal or looped (e.g., two lateral connections) when viewed from above. The shapes of the above-described regions of the device 20 may vary considerably from these examples.

Figure 2:
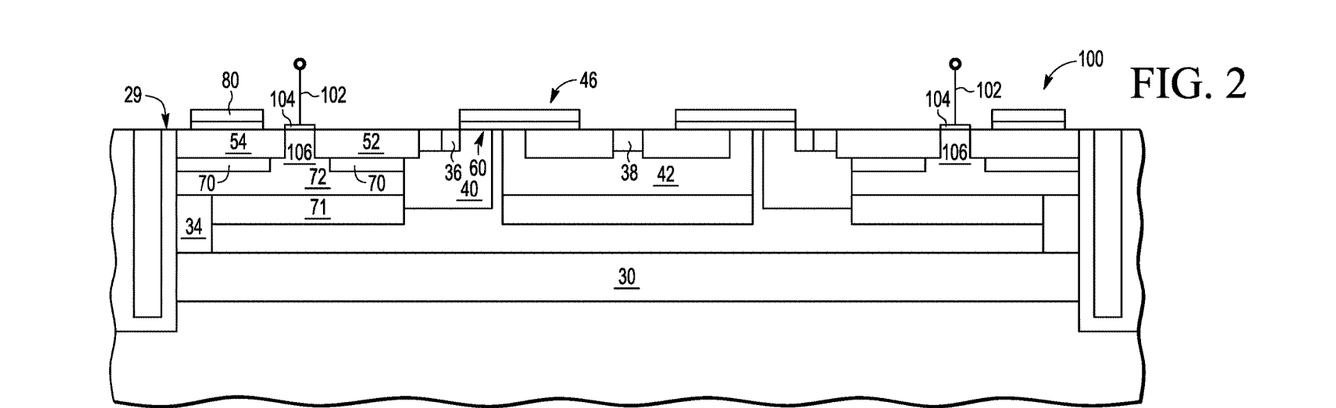
FIG. 2 is a cross-sectional, schematic, partial view of an example n-channel LDMOS (or NLDMOS) transistor with isolation via a RESURF layer arrangement and a Schottky isolation contact in accordance with one embodiment.

FIG. 2 depicts an example of an n-channel LDMOS device 100 having a RESURF layer arrangement in accordance with one embodiment. The device 100 is configured similarly in many respects to the n-channel examples described above in connection with FIG. 1. For example, the device 100 may have a similarly configured conduction path, including source region 36, drain region 38, body region 40, drift region 42, gate 46, and channel region 60. The device 100 may also have a similarly configured DTI ring 29 and doped isolation barrier, including buried isolation layer 30 and isolation well 34. Unless noted otherwise, the structures, components, and other elements of the device 100 may be configured as described above in connection with FIG. 1.

The elements of the device 100 directed to reducing impact ionization and partial biasing of the doped isolation barrier may be configured as described above. Thus, the device 100 includes a RESURF layer arrangement involving a stack of depleted regions or layers 70-72 and conductive flap 80. The conductivity types, dopant concentration profiles, implantation, and other characteristics of these regions may be as described above. As a result, the depleted nature of the layers 70-72 distribute the electrostatic potential more uniformly near the body region 40 and the layer 72 electrically couples the drain bias voltage to the doped isolation barrier in a manner that allows the doped isolation barrier to be biased at a voltage level lower than the drain bias voltage, as described above.

The device 100 differs from the above-described examples in connection with an isolation contact 102. The isolation contact 102 is again used to bias the doped isolation barrier of the device 100. But in this example, the isolation contact 102 is configured as a Schottky contact, rather than an Ohmic contact. The isolation contact 102 thus includes a Schottky diode at the surface 48 of the substrate 22. The isolation contact 102 may thus be referred to as a Schottky contact 102.

In the example of FIG. 2, the Schottky contact 102 includes a silicide layer 104 at the surface 48. A portion 106 of the well of the RESURF layer arrangement that forms the middle layer 72 provides the cathode of the Schottky diode. The portion 106 is disposed between the STI regions 52, 54. The portion 106 is part of the well not counter-doped by the p-type implant(s) used to form the other regions or layers of the RESURF layer arrangement. In some cases, the portion 106 of the well is unlike other portions of the middle layer 72, insofar as the portion 106 is not depleted (or fully depleted). Other portions of the well may also not be depleted (or fully depleted).

The Schottky contact 102 is useful in connection applications in which transient negative voltages may be experienced. For example, applications involving inductive loads, such as system on a chip (SOC) applications, may present a negative voltage across the load terminals of the device during switching. In such transient conditions, the node associated with the drain terminal is temporarily biased negative relative to the substrate 22, which may be grounded. This negative drain bias would then bring down the voltage at the doped isolation barrier, insofar as (1) the drain terminal is electrically tied to the isolation contact 102, and (2) the doped isolation barrier is partially "lifted" to the drain voltage via the RESURF layer arrangement, as described above. The doped isolation barrier (e.g., the buried isolation layer 30) would thus be at a negative voltage relative to the substrate 22. The negative voltage of the doped isolation barrier would be sufficiently negative to forward bias the diode at the interface between the doped isolation barrier and the substrate 22. An undesirable amount of substrate current would then occur.

The Schottky contact 102 limits the extent to which the voltage at the doped isolation barrier is pulled down during such transient events. The Schottky contact 102 is configured to block the transient negative voltage from reaching the RESURF layer arrangement. The transient negative voltage reverse-biases the Schottky diode of the Schottky contact 102. The Schottky diode thus acts as a voltage regulator. As a result, the voltage at the doped isolation barrier may only fall to a voltage near zero, in which case any resulting substrate current is negligible.

The example of FIG. 2 shows one way in which the above-described RESURF layer-based approach to breakdown voltage improvement and isolation voltage partial lifting is useful relative to other approaches. The above-described approach still involves an isolation contact. As a result, the above-described approach allows a Schottky contact to be relied upon to prevent substrate current during load transient events.

Notwithstanding the foregoing description, the presence of the Schottky contact 102 may be useful in circumstances in addition to those in which the node may swing to a negative voltage. The device 100 may thus be useful in applications other than those involving transient conditions and/or an inductive load.

Figure 3:
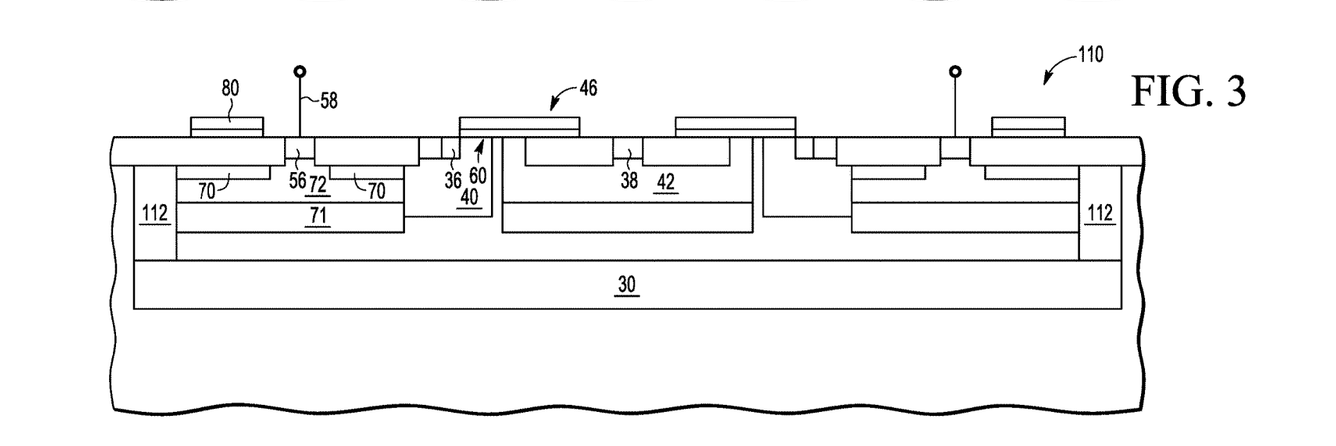
FIG. 3 is a cross-sectional, schematic, partial view of an example n-channel LDMOS (or NLDMOS) transistor with junction-based isolation via a RESURF layer arrangement in accordance with one embodiment.

FIG. 3 depicts an example of an n-channel LDMOS device 110 having a RESURF layer arrangement in accordance with one embodiment. The device 110 is configured similarly in many respects to the n-channel examples described above in connection with FIG. 1. For example, the device 110 may have a similarly configured conduction path, including source region 36, drain region 38, body region 40, drift region 42, gate 46, and channel region 60. The device 110 may also have a similarly configured isolation contact region 56, isolation contact 58, and buried isolation layer 30. Unless noted otherwise, the structures, components, and other elements of the device 110 may be configured as described above in connection with FIG. 1.

The elements of the device 110 directed to reducing impact ionization and partial biasing of the doped isolation barrier may be configured as described above. Thus, the device 110 includes a RESURF layer arrangement involving a stack of depleted regions or layers 70-72 and conductive flap 80. The conductivity types, dopant concentration profiles, implantation, and other characteristics of these regions may be as described above. As a result, the depleted nature of the layers 70-72 distribute the electrostatic potential more uniformly near the body region 40 and the layer 72 electrically couples the isolation contact 58 to the doped isolation barrier in a manner that allows the doped isolation barrier to be biased at a voltage level lower than the voltage applied to the isolation contact 58, as described above.

The device 110 differs from the above-described examples in connection with the lack of a DTI ring or other structure separating the device 110 from the remainder of the substrate neighborhood. Without a DTI ring, the sidewall of the doped isolation barrier is the sole mechanism for lateral isolation of the device 110. In this case, the sidewall is established by a well 112 of the doped isolation barrier that extends downward from STI region 54 to the buried isolation layer 30. The junction between the well 112 and the substrate 22 provides sufficient isolation for the device 110.

One or more pre-existing implant procedures may be used to form the well 112. For example, the implant used to form the well 34 (FIG. 1) may be combined with an additional pre-existing implant to increase the vertical extent of the well 34. The additional pre-existing implant may be used to form a body or other region of another transistor device, such as a p-channel LDMOS or analog transistor device.

The device 110 of FIG. 3 provides an example that exhibits the manner in which the above-described RESURF layer arrangements are compatible and well-suited for use with varying substrate types, configurations, and process technologies. Various bulk substrate technologies may be used.

Figure 4:
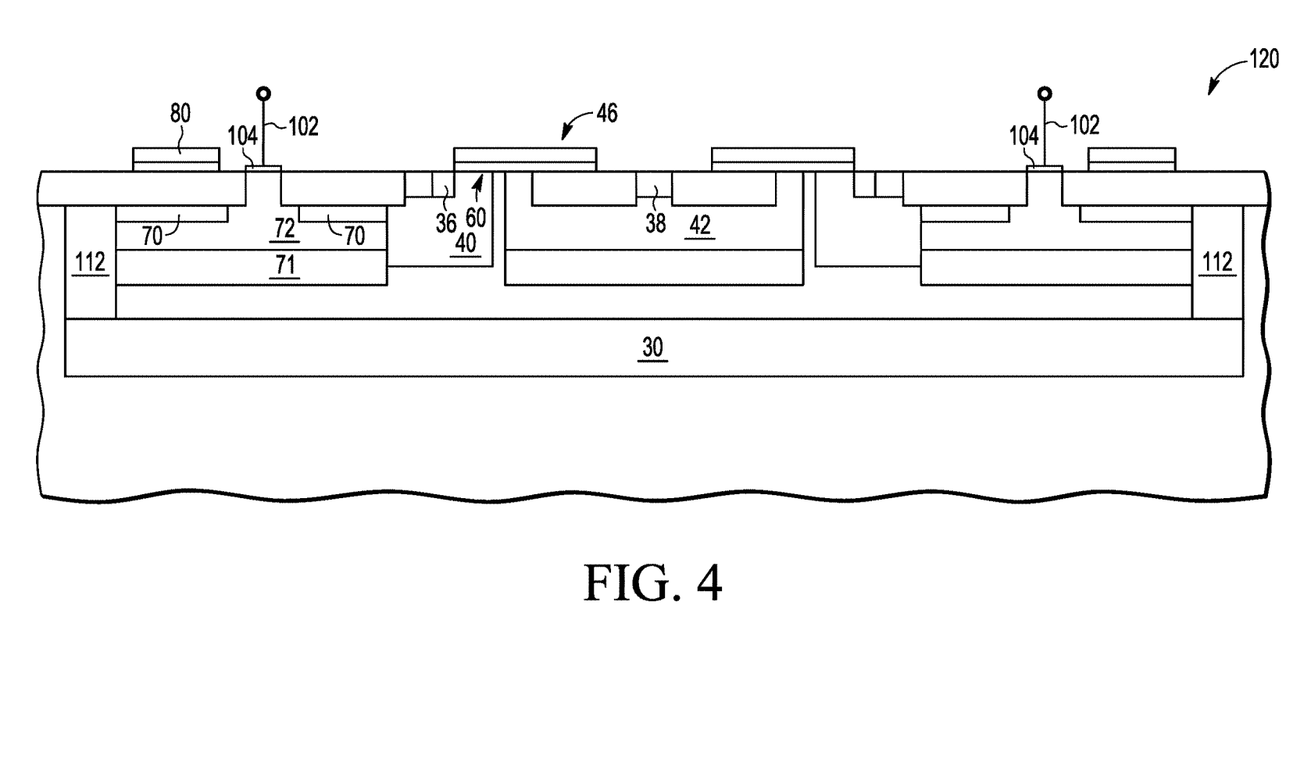
FIG. 4 is a cross-sectional, schematic, partial view of an example n-channel LDMOS (or NLDMOS) transistor with junction-based isolation via a RESURF layer arrangement and a Schottky isolation contact in accordance with one embodiment.

FIG. 4 depicts an example of an n-channel LDMOS device 120 having a RESURF layer arrangement in accordance with one embodiment. The device 120 is configured similarly in many respects to the n-channel examples described above in connection with FIGS. 1-3. For example, the device 120 may have a similarly configured conduction path, including source region 36, drain region 38, body region 40, drift region 42, gate 46, and channel region 60. Unless noted otherwise, the structures, components, and other elements of the device 120 may be configured as described above in connection with FIG. 1.

The elements of the device 120 directed to reducing impact ionization and partial biasing of the doped isolation barrier may be configured as described above. Thus, the device 120 includes a RESURF layer arrangement involving a stack of depleted regions or layers 70-72 and conductive flap 80. The conductivity types, dopant concentration profiles, implantation, and other characteristics of these regions may be as described above. As a result, the depleted nature of the layers 70-72 distribute the electrostatic potential more uniformly near the body region 40 and provide electrical coupling as described above.

The device 120 exhibits a combination of the features of the examples of FIGS. 2 and 3. The device 120 has a Schottky isolation contact 102 as described above in connection with FIG. 2. The device 120 lacks a DTI ring or other structure separating the device 120 from the remainder of the substrate neighborhood as described above in connection with FIG. 3. The device 120 accordingly includes a well 112 as shown in FIG. 3.

Other combinations of the various features and aspects of the embodiments may also be provided.

The above-described devices are shown in simplified form. For example, FIGS. 1-4 do not show a number of other metal layers configured for interconnections with the electrodes. The devices may have a number of other structures or components for connectivity, isolation, passivation, and other purposes not shown in FIGS. 1-4 for ease in illustration. For instance, the devices may include a number of additional backside layers.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
| --- | --- | --- |
| p-epi 24: | $1 \times 10^{13}$-$1 \times 10^{16}$/cm$^3$ | 3-10 μm |
| substrate 26: | $1 \times 10^{14}$-$1 \times 10^{19}$/cm$^3$ | not applicable |
| buried layer 30: | $1 \times 10^{15}$-$5 \times 10^{19}$/cm$^3$ | 0.5-5 μm |
| wells 34, 112: | $1 \times 10^{15}$-$1 \times 10^{19}$/cm$^3$ | 0.5-5 μm |
| source 36: | $1 \times 10^{20}$-$1 \times 10^{23}$/cm$^3$ | 0.05-0.5 μm |
| drain 38: | $1 \times 10^{20}$-$1 \times 10^{23}$/cm$^3$ | 0.05-0.5 μm |
| body 40: | $1 \times 10^{15}$-$1 \times 10^{19}$/cm$^3$ | 0.2-5 μm |
| drift 42: | $1 \times 10^{15}$-$5 \times 10^{18}$/cm$^3$ | 0.1-3 μm |
| well 66: | $1 \times 10^{15}$-$5 \times 10^{18}$/cm$^3$ | 0.1-3 μm |
| layer 70: | $1 \times 10^{15}$-$5 \times 10^{18}$/cm$^3$ | 0.1-3 μm |
| layer 71: | $1 \times 10^{15}$-$5 \times 10^{18}$/cm$^3$ | 0.1-3 μm |
| layer 72: | $1 \times 10^{15}$-$5 \times 10^{18}$/cm$^3$ | 0.1-3 μm |

The concentrations and thicknesses may be different in other embodiments. For example, the dopant concentration of the bulk substrate 26 may vary considerably.

Figure 5:
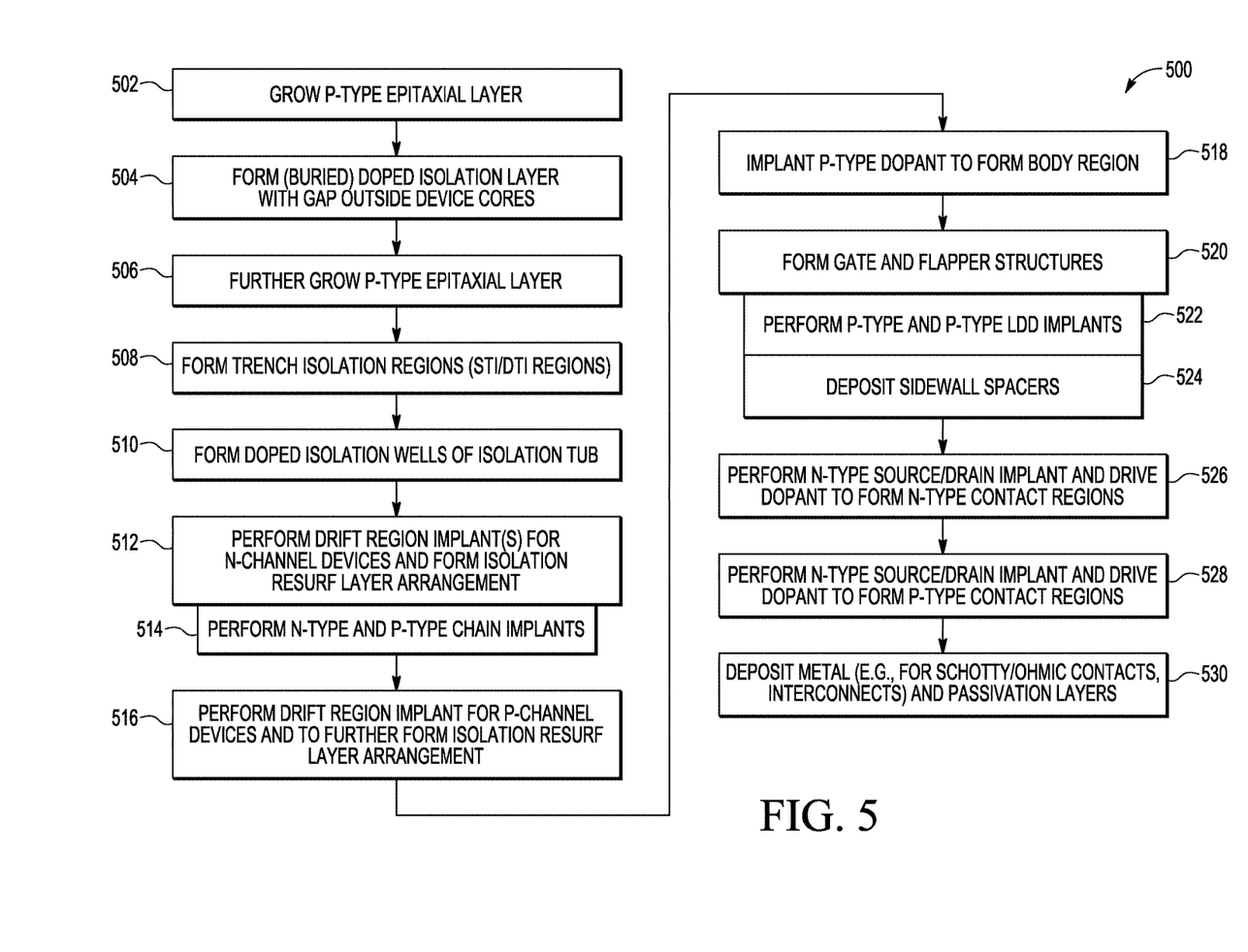
FIG. 5 is a flow diagram of an example fabrication sequence to construct n-channel LDMOS (or NLDMOS) transistors with isolation via a RESURF layer arrangement in accordance with one embodiment.

FIG. 5 shows an exemplary method 500 for fabricating one or more of the above-described devices. In this example, the method 500 is configured to fabricate n-channel devices. The devices may be LDMOS devices having a RESURF layer arrangement as described above. The devices are fabricated with a p-type bulk semiconductor substrate, the regions or layers of which may have the conductivity types of the n-channel examples described above, or be alternatively fabricated with an n-type substrate. The method includes a sequence of acts, only the salient of which are depicted for convenience in illustration.

The ordering of the acts may vary in other embodiments. For example, an act directed to forming isolation wells may be implemented after one or more acts configured to form drift regions and/or other regions disposed along the conduction paths of the devices.

The method 500 may begin with one or more acts directed to the growth or other formation of one or more epitaxial layers. In this example, a p-type epitaxial layer is grown on a p-type bulk substrate in an act 502. In some cases, e.g., where the p-type bulk substrate is lightly doped, the act 502 may be optional, e.g., in the interest of reducing process costs. During or after the formation of the epitaxial layer, an isolation layer is formed in an act 504. The act 504 may include a dopant implantation or other doping technique. In other cases, the isolation layer is formed before the growth of an epitaxial layer. In either case, the method 500 then includes growth (e.g., further growth) of a p-type epitaxial layer in an act 506. As a result, the isolation layer becomes a buried isolation layer.

In the example of FIG. 5, a number of trench isolation regions are formed in an act 508. In some cases, both STI regions and DTI structures are formed. Alternatively, only STI regions are formed. The STI regions may be used to define and separate active areas within and around the device area. For example, one or more STI regions may also be used to space a drain region from a gate structure in a field drift arrangement, as described above. The STI regions are also formed to establish an area of an isolation contact, such as the Ohmic and Schottky contacts described above. The DTI structures may be ring-shaped to define a device area for each device. In some cases, one or more steps of the act 508 are implemented after implementation of one or more the implant procedures described below.

The STI regions and DTI structures may be formed via any now known or hereafter developed procedure. In some cases, the act 508 may include the formation of a trench and the deposition (e.g., chemical vapor deposition, or CVD) of one or more materials in the trench. In some embodiments, the trench is filled with silicon oxide. Additional or alternative materials may be deposited.

In an act 510, one or more implantation procedures are performed to form a sidewall of a doped isolation barrier. The implantation procedures may be configured to dope the substrate to form one or more isolation wells, which may be vertically stacked upon one another to define the sidewall. The sidewall of the doped isolation barrier defines the lateral boundary of the respective device area of each device. The isolation wells may be positioned to extend upward from the buried isolation layer such that doped isolation barrier is shaped as an isolation tub. The isolation wells may be disposed along a DTI structure, as described above. The act 510 may be performed at various points in the fabrication procedure.

One or more dopant implantations are performed in an act 512 to form a number of layers or well or other regions of the devices and, in some cases, other devices. Each implantation may be configured to form multiple wells, layers or other regions. The multiple wells, layers, or other regions of each implantation are configured and positioned for different purposes.

The act 512 includes one or more n-type implantation procedures and one or more p-type implantation procedures. The implantation procedures are configured to form a drift region of the n-channel device, as well as one or more depleted wells, regions or layers of a RESURF arrangement for reduced impact ionization and partially lifted isolation biasing, as described above. The RESURF arrangement may include multiple RESURF layers arranged in a stack between the body region and the area established for the isolation contact. One of the layers is configured to electrically couple the isolation contact and the doped isolation barrier to support the partial biasing of the doped isolation barrier, as described above.

In the example of FIG. 5, the act 512 includes an act 514 in which chain implantation procedures are implemented. The chain implantation procedures use a common mask. In one example, the chain implantation procedures include a single n-type implantation procedure and a single p-type implantation procedure. The n-type implantation procedure is configured to form the drift region of the device. The p-type implantation procedure is configured to form a buried well region disposed adjacent to the drift region for depletion thereof. The n-type and p-type implantation procedures are also used to form the layers of the RESURF arrangement outside of the conduction path. The act 512 may include additional implantation procedures using the same or different masks.

In the example of FIG. 5, an additional p-type implantation procedure is implemented in an act 516 to further form the RESURF layer arrangement. The additional implantation procedure, when combined with the implantation procedures of the act 512, may be configured to produce the dopant concentration profiles of the RESURF layer arrangements shown in, for example, FIGS. 1-4. For instance, the combination of the implantation procedures may be configured to define upper, middle, and buried layers of the RESURF layer arrangement. The masks of one or more of the p-type implantation procedures may be configured to define outer and inner segments of the upper layer. The upper and buried layers may be formed through counter-doping the n-type well formed by the n-type implantation procedure of the act 512. The counter-doping also defines the middle layer of the RESURF layer arrangement that acts as an isolation coupling layer as described above. The additional p-type implantation procedure may also be configured to form a drift region of other transistor devices having an oppositely doped body region, which, in this case, are p-channel devices.

The method 500 also includes an act 518 in which the substrate is doped to form body regions of the devices. The act 518 may include one or more dopant implantation procedures. In this n-channel device case, the act 518 includes a single p-type dopant implantation procedure.

The order in which the above-described implantation procedures are implemented may vary from the order shown in FIG. 5.

The fabrication process may then include one or more procedures collectively shown in act 520. The procedures are directed to forming gate structures and other structures involving polysilicon, such as the conductive flap structures described above. One or more components of the gate and other structures may be initially be formed. For instance, a gate dielectric layer and conductive plate may be deposited and patterned. A number of implants may then be performed in an act 522 to form LDD regions. After the dopant for the LDD regions is implanted, sidewall spacers may then be deposited in an act 524. The sidewall spacers and/or other components of the gate structure may then be used for self-alignment of a source region.

In act 526 and 528, n-type and p-type source/drain implantations are performed to form the various n-type and p-type contact regions of the devices, respectively. Source and drain regions may thus be formed for both the n-channel and p-channel devices. In examples having Ohmic isolation contacts, the n-type source/drain implantation is also configured to form an isolation contact region. The p-type body contact regions are also formed.

A number of metal and passivation layers may then be deposited on the substrate in an act 530. The metal layers may be patterned to form Ohmic and Schottky contacts and electrodes, including the isolation contacts as described above. For instance, one or more metal layers deposited in the act 530 are used to form a silicide layer of a Schottky isolation contact. One or more of the metal layers are also patterned to form various interconnects, including interconnects to bias the isolation contacts as described above. In some cases, one or more of the metal layers are deposited to form conductive flaps, as described above.

Additional, fewer, or alternative acts may be implemented. For example, any number of epitaxial layers may be grown on the original, bulk substrate. A number of acts are optional, including, for instance, acts related to elements or aspects of a gate structure or the channel, such as the formation of sidewall spacers and LDD regions.

Described above are transistor devices and fabrication methods involving RESURF layer arrangements for high voltage operation. The RESURF layer arrangements improve the distribution of the high bias voltage in both the lateral and vertical dimensions between the device body and the isolation contact and doped isolation barrier (e.g., isolation tub). The RESURF layer arrangements provide the improved distribution of the electrostatic potential differences while also biasing the doped isolation barrier at a lower voltage than, for instance, the drain bias voltage.

The positioning of the RESURF layers between the device body and isolation components is useful in circumstances in which separation via the epitaxial layer (or other substrate element) does not help prevent breakdown. The breakdown voltage of power transistor devices would be expected to rise as the width of that epitaxial (or other) separation increases. In at least some cases, the breakdown voltage may, in fact, decrease due to a greater likelihood of impact ionization in the vertical dimension. In those cases, the RESURF layers may be useful for achieving a desired breakdown voltage level. Moreover, the breakdown voltage level may be achieved without detrimental or other increases in device width. Notwithstanding the foregoing, the RESURF layer arrangements of the disclosed devices may be useful in other circumstances.

Although described as useful in connection with inductive loads, the disclosed transistor devices may be useful in a variety of other applications. The transistor devices are not limited to any particular application or type of load.

Although described in connection with respective n-channel LDMOS transistors, the disclosed devices are not limited to any particular transistor configuration. The RESURF layer arrangement of the disclosed devices may be useful in a wide variety of power electronic devices. For instance, application of the features of the disclosed devices is not limited to LDMOS or other power MOS devices. The transistor devices are also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, n-channel LDMOS devices with a p-type substrate are described and illustrated. However, the disclosed devices are not limited to p-type substrates, such that other types of devices may be provided by, for example, substitution of semiconductor regions of opposite conductivity type. Thus, for example, each semiconductor region, layer or other structure in the example described in connection with FIGS. 1 and 2 may have a conductivity type (e.g., n-type or p-type) opposite to the type identified in the examples below.

In a first aspect, a device includes a semiconductor substrate, a doped isolation barrier disposed in the semiconductor substrate, a body region disposed in the semiconductor substrate within the doped isolation barrier and in which a channel is formed during operation, an isolation contact disposed at the semiconductor substrate and to which a voltage is applied during operation, and a plurality of reduced surface field (RESURF) layers disposed in the semiconductor substrate, the plurality of reduced surface field (RESURF) layers being arranged in a stack between the body region and the isolation contact.

In a second aspect, a device includes a semiconductor substrate, a body region disposed in the semiconductor substrate and in which a channel is formed during operation, a doped isolation barrier disposed in the semiconductor substrate and within which the body region is disposed, an isolation contact at a surface of the semiconductor substrate laterally inward of the doped isolation barrier, and to which a voltage is applied during operation, and a depleted region disposed in the semiconductor substrate between the isolation contact and the doped isolation barrier. The depleted region electrically couples the isolation contact and the doped isolation barrier such that the doped isolation barrier is biased at a voltage level lower than the voltage applied to the isolation contact.

In a third aspect, a method of fabricating a transistor includes doping a semiconductor substrate to form a sidewall of a doped isolation barrier of the transistor, doping the semiconductor substrate to form a body region of the transistor, forming trench isolation regions to establish an area of an isolation contact, and performing a plurality of dopant implantation procedures to form a plurality of reduced surface field (RESURF) layers in the semiconductor substrate, the plurality of reduced surface field (RESURF) layers being arranged in a stack between the body region and the area of the isolation contact.

References to a well region or other doped region of a semiconductor having a certain conductivity type are intended to specify that the region has a net dopant concentration of the type indicated to support the indicated conductivity type. The region may have dopant of the other conductivity type therein, but the amount of such opposite dopant is insufficient to change the effective, or net, conductivity type of the region.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
a semiconductor substrate;
a doped isolation barrier disposed in the semiconductor substrate;
a body region disposed in the semiconductor substrate within the doped isolation barrier and in which a channel is formed during operation;
an isolation contact disposed at the semiconductor substrate and to which a voltage is applied during operation; and
a plurality of reduced surface field (RESURF) layers disposed in the semiconductor substrate, the plurality of reduced surface field (RESURF) layers being arranged in a stack between the body region and the isolation contact, wherein
the plurality of RESURF layers comprise an isolation coupling layer that electrically couples the isolation contact and the doped isolation barrier.

2. The device of claim 1, wherein the plurality of RESURF layers are laterally adjacent to, and in contact with, the body region.

3. The device of claim 1, wherein some of the plurality of RESURF layers extend laterally from the body region to a sidewall of the doped isolation barrier.

4. The device of claim 1, wherein the isolation contact is disposed within, and laterally offset from, a sidewall of the doped isolation barrier.

5. The device of claim 1, wherein:
the isolation contact is configured as a Schottky contact;
the plurality of RESURF layers comprises a well; and
a portion of the well forms a cathode of the Schottky contact.

6. The device of claim 1, wherein:
the plurality of RESURF layers comprise an upper layer, a buried layer, and a middle layer disposed between the upper and buried layers;
the upper and buried layers have a first conductivity type in common with the body region;
the middle layer has a second conductivity type in common with the doped isolation barrier.

7. The device of claim 6, wherein the middle layer is configured as the isolation coupling layer that couples the isolation contact and the doped isolation barrier.

8. The device of claim 6, wherein:
the upper layer is discontinuous with a gap at the isolation contact; and
the plurality of RESURF layers comprises a well having a first portion that forms the middle layer and a second portion disposed in the gap in the upper layer.

9. A device comprising:
a semiconductor substrate;
a body region disposed in the semiconductor substrate and in which a channel is formed during operation;
a doped isolation barrier disposed in the semiconductor substrate and within which the body region is disposed;
an isolation contact at a surface of the semiconductor substrate laterally inward of the doped isolation barrier, and to which a voltage is applied during operation; and
a depleted region disposed in the semiconductor substrate between the isolation contact and the doped isolation barrier, wherein
the depleted region electrically couples the isolation contact and the doped isolation barrier such that the doped isolation barrier is biased at a voltage level lower than the voltage applied to the isolation contact,
the depleted region is one layer of a plurality of layers arranged in a stack,
the plurality of layers comprise an upper layer and a buried layer,
the depleted region is disposed between the upper and buried layers,
the upper and buried layers have a first conductivity type in common with the body region,
the depleted region has a second conductivity type in common with the doped isolation barrier,
the upper layer is discontinuous with a gap at the isolation contact, and
a portion of the depleted region is disposed in the gap in the upper layer.

10. The device of claim 9, wherein the depleted region is laterally adjacent to, and in contact with, the body region.

11. The device of claim 9, wherein the depleted region extends laterally from the body region to a sidewall of the doped isolation barrier.

12. A device comprising:
a semiconductor substrate;
a body region disposed in the semiconductor substrate and in which a channel is formed during operation;
a doped isolation barrier disposed in the semiconductor substrate and within which the body region is disposed;
an isolation contact at a surface of the semiconductor substrate laterally inward of the doped isolation barrier, and to which a voltage is applied during operation, wherein the isolation contact is configured as a Schottky contact; and
a depleted region disposed in the semiconductor substrate between the isolation contact and the doped isolation barrier, wherein
the depleted region electrically couples the isolation contact and the doped isolation barrier such that the doped isolation barrier is biased at a voltage level lower than the voltage applied to the isolation contact.

* * * * *